(12) United States Patent
Chen et al.

(10) Patent No.: US 10,714,435 B2
(45) Date of Patent: Jul. 14, 2020

(54) FAN-OUT ANTENNA PACKAGING STRUCTURE AND METHOD MAKING THE SAME

(71) Applicant: SJ Semiconductor (Jiangyin) Corporation, Huaiyin District, Jiangyin, Jiangsu Province (CN)

(72) Inventors: Yenheng Chen, Jiangyin (CN); Chengchung Lin, Jiangyin (CN); Chengtar Wu, Jiangyin (CN); Jangshen Lin, Jiangyin (CN)

(73) Assignee: SJ Semiconductor (Jiangyin) Corporation, Jiangyin (CN)

( * ) Notice: Subject to any disclaimer, the term of this patent is extended or adjusted under 35 U.S.C. 154(b) by 0 days.

(21) Appl. No.: 16/209,799

(22) Filed: Dec. 4, 2018

(65) Prior Publication Data

US 2019/0172803 A1    Jun. 6, 2019

(51) Int. Cl.

| | |
|---|---|
| *H01L 23/66* | (2006.01) |
| *H01Q 1/22* | (2006.01) |
| *H01L 23/00* | (2006.01) |
| *H01L 23/522* | (2006.01) |
| *H01L 21/56* | (2006.01) |
| *H01L 23/528* | (2006.01) |
| *H01L 23/538* | (2006.01) |

(Continued)

(52) U.S. Cl.
CPC .......... *H01L 23/66* (2013.01); *H01L 21/566* (2013.01); *H01L 23/49822* (2013.01); *H01L 23/528* (2013.01); *H01L 23/5226* (2013.01); *H01L 23/5389* (2013.01); *H01L 24/11* (2013.01); *H01L 24/14* (2013.01); *H01L 24/19* (2013.01); *H01L 24/20* (2013.01); *H01Q 1/2283* (2013.01); *H01Q 1/36* (2013.01); *H01L 2223/6677* (2013.01); *H01L 2224/02379* (2013.01); *H01L 2224/12105* (2013.01); *H01L 2224/18* (2013.01)

(58) Field of Classification Search
CPC ....... H01L 23/66; H01L 24/11; H01L 23/528; H01L 2224/18; H01L 2224/02379; H01L 2223/6677; H01L 23/5389; H01L 23/5226; H01L 21/566; H01L 24/20; H01L 22/14; H01L 24/19; H01L 23/49822; H01L 21/568; H01L 2224/12105; H01Q 1/36

See application file for complete search history.

(56) References Cited

U.S. PATENT DOCUMENTS

| | | | |
|---|---|---|---|
| 2015/0179616 A1* | 6/2015 | Lin | ............. H01L 25/50 257/773 |
| 2017/0033062 A1* | 2/2017 | Liu | ............. H01L 23/66 |

* cited by examiner

*Primary Examiner* — Jasmine J Clark
(74) *Attorney, Agent, or Firm* — Alston & Bird LLP

(57) ABSTRACT

The present application provides a fan-out antenna packaging structure and a method making the same. The method comprises: providing a carrier and forming a release layer on an upper surface of the carrier; forming a chip structure on an upper surface of the release layer, the chip structure comprises an unpacked chip and a contact pad disposed on and electrically connected to the unpacked chip; forming a plastic packaging layer packaging the chip structure on the upper surface of the release layer; removing the carrier and the release layer to expose the contact pad; forming a single-layer antenna structure and forming a redistribution layer on the surface where the contact pad is disposed; forming an under-bump metal layer on an upper surface of the redistribution layer; and forming a solder ball bump on an upper surface of the under-bump metal layer.

11 Claims, 7 Drawing Sheets

(51) Int. Cl.
*H01Q 1/36* (2006.01)
*H01L 23/498* (2006.01)

FAN-OUT ANTENNA PACKAGING STRUCTURE AND METHOD MAKING THE SAME

CROSS REFERENCES TO RELATED APPLICATIONS

This application claims the benefit of priority to Chinese Patent Application No. CN2017112594894, entitled "Fan-out Antenna Packaging Structure and Method Making the Same", filed with SIPO on Dec. 4, 2017, and Chinese Patent Application No. CN2017216628838, entitled "Fan-out Antenna Packaging Structure", filed with SIPO on Dec. 4, 2017, the contents of which are incorporated herein by reference in its entirety.

TECHNICAL FIELD

The present application relates to the technical field of semiconductor packaging, in particular to a fan-out antenna packaging structure and a method making the same.

BACKGROUND

Lower-cost, more reliable, faster and higher-density circuits are the goals pursued by integrated circuit packaging. In the future, integrated circuit packaging will increase the integration density of various electronic components by continuously reducing the minimum feature size. At present, advanced packaging methods include Wafer Level Chip Scale Packaging (WLCSP), Fan-Out Wafer Level Package (FOWLP), Flip Chip (Flip Chip), Package on Package (POP), and so on.

Fan-out wafer level packaging is an embedded chip packaging method based on wafer level processing, and it is one of the advanced packaging methods with more input/output (I/O) ports and better integration flexibility. Fan-out wafer level packaging has the following unique advantages compared with conventional wafer level packaging: 1) I/O spacing is flexible, which is independent of chip size; 2) only effective dies are used and the product yield can be improved; 3) having flexible3D packaging path, that is, patterns in any array can be formed at the top part; 4) having better electrical performance and thermal performance; 5) high frequency application; and 6) it is easy to achieve high-density wiring in a redistribution layer (RDL).

At present, a fan-out wafer level packaging method of radio frequency chips generally comprises the following steps: providing a carrier and forming a release layer on a surface of the carrier; photo-etching and electroplating on the adhesive layer to obtain a redistribution layer (RDL); mounting the radio frequency chip on the redistribution layer by adopting a chip bonding process; packaging the chip in a plastic packaging material layer by adopting an injection molding process; removing the carrier and the release layer; photo-etching and electroplating on the redistribution layer to form an Under-Bump Metal (UBM) layer; performing ball placement and reflow on the UBM layer to form a solder ball bump; and then performing wafer bonding and dicing. To achieve better communication effects, antennas are provided when the radio frequency chip is used, and for the existing antennas, antennas are directly laid out on a PCB or interfaces for connecting external antennas are left by developers when layout design is performed for radio frequency function modules; however, due to inconvenience in connecting the external antennas, most of the existing radio frequency antennas are directly laid out on the PCB, and in order to ensure the antenna gain, this will inevitably be at the expense of sacrificing the PCB area.

In view of this, it is necessary to design a new fan-out antenna packaging structure and a method making the same to solve the above-mentioned technical problems.

SUMMARY

In view of the disadvantages of the prior art, the present application provides a fan-out antenna packaging structure and a method of making the same, which are used for solving the problem that the existing radio frequency chip needs to be externally connected to an antenna during use, resulting in the area to be become larger.

The present application provides a method for fabricating a fan-out antenna packaging structure, comprising:

step 1) providing a carrier and forming a release layer on an upper surface of the carrier;

step 2) forming a chip structure on an upper surface of the release layer, wherein the chip structure comprises an unpacked chip and a contact pad disposed on and electrically connected to the unpacked chip, wherein the contact pad is in contact with the release layer;

step 3) forming a plastic packaging layer on the upper surface of the release layer, wherein the plastic packaging layer encloses the chip structure;

step 4) removing the carrier and the release layer to expose the contact pad;

step 5) forming a single-layer antenna structure and forming a redistribution layer on the surface where the contact pad is located, wherein the redistribution layer is electrically connected to the contact pad and the antenna structure is electrically connected to the redistribution layer;

step 6) forming an under-bump metal layer on an upper surface of the redistribution layer; and step 7) forming a solder ball bump on an upper surface of the under-bump metal layer.

Preferably, forming the redistribution layer and the antenna structure comprises:

step 5.1a) forming a dielectric layer on the surface where the contact pad is located, and performing photo-etching to the dielectric layer to form a first opening and a second opening in the dielectric layer, wherein the first opening exposes the contact pad; and step 5.2a) forming a metal wire layer in the first opening and the second opening, wherein the metal wire layer in the first opening is electrically connected to the contact pad to form the redistribution layer, and the metal wire layer in the second opening is electrically connected to the redistribution layer to form the antenna structure.

Preferably, forming the redistribution layer and the antenna structure comprises:

step 5.1b) forming a first dielectric layer on the surface where the contact pad is located, and performing photo-etching to the first dielectric layer to form a first opening and a second opening in the first dielectric layer, wherein the first opening exposes the contact pad;

step 5.2b) forming a first metal wire layer in the first opening and the second opening, wherein the first metal wire layer in the first opening is electrically connected to the contact pad, and the first metal wire layer in the second opening forms the antenna structure; and step 5.3b) forming at least one layer of stack structure consisting of a second dielectric layer and a second metal wire layer on an upper surface of the first metal wire layer to form the redistribution layer, wherein the second metal wire layer is electrically connected to the first metal wire layer in the first opening, and the antenna structure is electrically connected to the redistribution layer.

Preferably, the antenna structure is formed on an outer side of the under-bump metal layer, wherein the antenna structure is in a rectangular wire-wound configuration and surrounds the under-bump metal layer.

Preferably, the antenna structure is formed on an outer side of the under-bump metal layer, wherein the antenna structure comprises at least one antenna unit, and the antenna unit is in a rectangular wire-wound configuration.

Preferably, the antenna structure is formed on an inner side of the under-bump metal layer, wherein the antenna structure comprises at least one antenna unit, and the antenna unit is in a rectangular wire-wound configuration.

The present application further provides a fan-out antenna packaging structure, comprising:
a chip structure comprising an unpacked chip and a contact pad disposed on and electrically connected to the unpacked chip;
a plastic packaging layer surrounding the chip structure and exposing the surface where the contact pad is located;
a redistribution layer and a single-layer antenna structure formed on the plastic packaging layer and an upper surface of the chip structure, wherein the redistribution layer is electrically connected to the contact pad, and the antenna structure is electrically connected to the redistribution layer;
an under-bump metal layer formed on an upper surface of the redistribution layer; and
a solder ball bump formed on an upper surface of the under-bump metal layer.

Preferably, the redistribution layer comprises at least one layer of stack structure formed on the plastic packaging layer and the upper surface of the chip structure, wherein the stack structure comprises a dielectric layer and a metal wire layer.

Preferably, the antenna structure is formed on an outer side of the under-bump metal layer, is in a rectangular wire-wound configuration and surrounds the under-bump metal layer.

Preferably, the antenna structure comprises at least one antenna unit formed on an outer side of the under-bump metal layer, wherein the antenna unit is in a rectangular wire-wound configuration.

Preferably, the antenna structure comprises at least one antenna unit formed on an inner side of the under-bump metal layer, wherein the antenna unit is in a rectangular wire-wound configuration.

As described above, the fan-out antenna packaging structure and the method making the same provided by the present application have the following beneficial effects: by forming the single-layer antenna structure and forming the redistribution layer in the present application, i.e., using the same photo-etching plate to form the redistribution layer and the antenna structure, the manufacturing cost is greatly reduced; moreover, through the design of the antenna structure in the present application, the size of the antenna structure is greatly reduced, the width of the antenna structure is reduced, and the gain of the antenna structure is greatly improved; and by integrally packaging the antenna structure on the chip structure, the integration of the chip packaging structure is improved.

DESCRIPTION OF COMPONENT REFERENCE SIGNS

Figure 1:
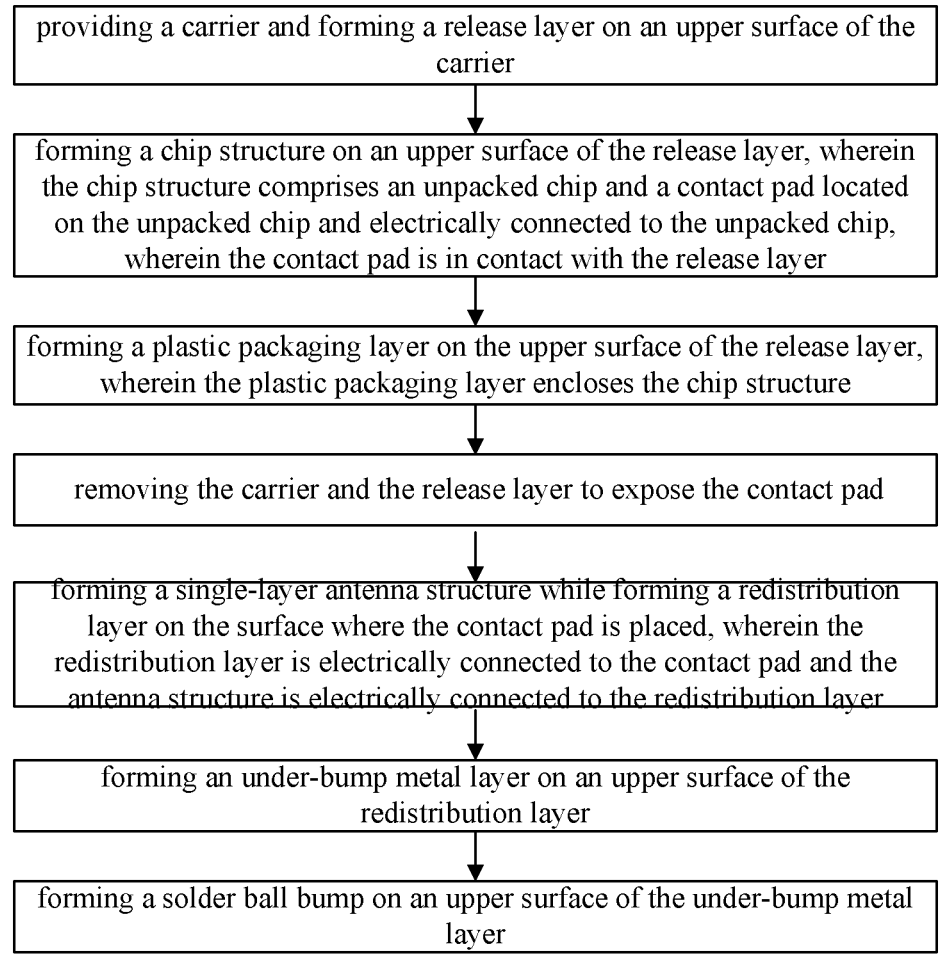
FIG. 1 illustrates a flowchart of a method for fabricating a fan-out antenna packaging structure according to embodiment 1 of the present application.

10 Carrier
20 Release layer
30 Chip structure
31 Unpacked chip
32 Contact pad
40 Plastic packaging layer
50 Dielectric layer
51 First opening
52 Second opening
60 Redistribution layer
70 Antenna structure
80 Under-bump metal layer
81 Dielectric layer
82 Metal wire layer
90 Solder ball bump
91 Metal pole
92 Solder ball

DETAILED DESCRIPTION OF THE PREFERRED EMBODIMENTS

The implementation modes of the present application will be described below through specific embodiments. Those skilled in the art can easily understand other advantages and effects of the present application according to contents disclosed in the present specification.

It needs to be noted that the structures, scales, sizes and the like illustrated in the drawings of the specification are only used for cooperating with the contents disclosed in the specification to allow those skilled in the art to understand and read instead of limiting the implementable limitation conditions of the present application, and thus having no technical substantive meanings; and any structural modifications, changes of scaling relations or adjustments to sizes shall still fall into the scope which can be covered by the technical contents disclosed by the present application under the situation that the effects which can be produced by the present application and the purposes which can be achieved by the present application are not influenced. In addition, words such as "above", "below", "left", "right", "middle" and "one" cited in the specification are just used for facilitating clear description instead of limiting the implementable scope of the present application. Changes or adjustments of relative relations thereof shall also be deemed as the implementable scope of the present application under the situation that the technical contents are not substantively changed.

Embodiment 1

As illustrated in FIG. 1, this embodiment provides a method for fabricating a fan-out antenna packaging structure, comprising:
step 1) providing a carrier 10 and forming a release layer 20 on an upper surface of the carrier 10;
step 2) forming a chip structure 30 on an upper surface of the release layer 20, wherein the chip structure 30 comprises an unpacked chip 31 and a contact pad 32 located on the chip 31 and electrically connected to the unpacked chip 31, wherein the contact pad 32 is in contact with the release layer 20;

step 3) forming a plastic packaging layer 40 on the upper surface of the release layer 20, wherein the plastic packaging layer 40 encloses the chip structure 30;

step 4) removing the carrier 10 and the release layer 20 to expose the contact pad 32;

step 5) forming a single-layer antenna structure 70 and forming a redistribution layer 60 on the surface where the contact pad 32 is disposed, wherein the redistribution layer 60 is electrically connected to the contact pad 32 and the antenna structure 70 is electrically connected to the redistribution layer 60;

step 6) forming an under-bump metal layer 80 on an upper surface of the redistribution layer 60; and step 7) forming a solder ball bump 90 on an upper surface of the under-bump metal layer 80.

Referring to FIGS. 2 to 10. The method for fabricating the fan-out antenna packaging structure according to this embodiment will be described below in detail.

Figure 2:
FIGS. 2 to 10 illustrate cross sectional views in each step of a method for fabricating a fan-out antenna packaging structure according to embodiment 1 the present application.
Figure 3:
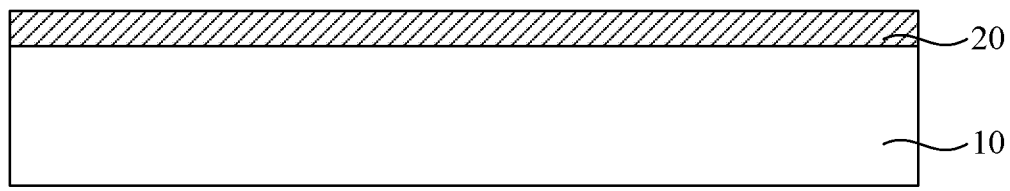

As illustrated in FIG. 2 and FIG. 3, a carrier 10 is provided and a release layer 20 is formed on an upper surface of the carrier 10.

As an example, a material of the carrier 10 includes but not limited to a combination of silicon, glass, silicon oxide, ceramics, polymer and metal, and the carrier 10 may be a wafer, a square or any other type of shape.

As an example, the material of the release layer 20 includes but not limited to adhesive tape, adhesive, epoxy, silicone rubber, polyimide (PI), polybenzoxazole (PBO) orbenzocyclobutene (BCB), and is formed by UV (ultraviolet) curing or thermal curing, so as to be used as a separation layer between the carrier 10 and the chip structure 30.

Figure 4:
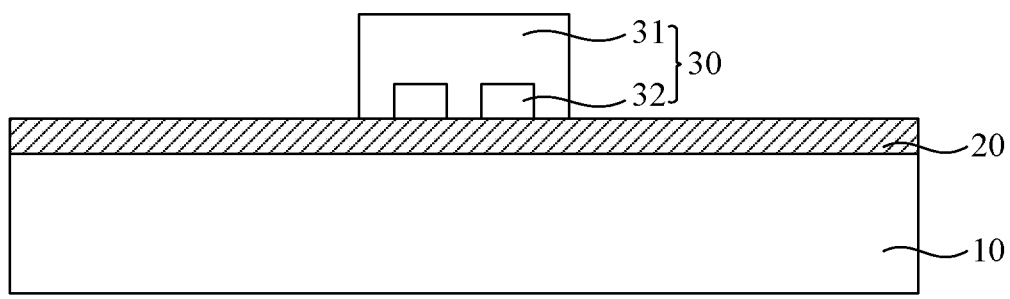

As illustrated in FIG. 4, a chip structure 30 is formed on an upper surface of the release layer 20, wherein the chip structure 30 comprises an unpacked chip 31 and a contact pad 32 disposed on and electrically connected to the unpacked chip 31, wherein the contact pad 32 is in contact with the release layer 20.

As an example, the chip structure 30 may be any one of existing radio frequency communication chips for transmitting and receiving communication information.

As an example, the material of the contact pad 32 includes, but not limited to, one or more of copper, aluminum, nickel, gold, silver, tin, and titanium.

Figure 5:
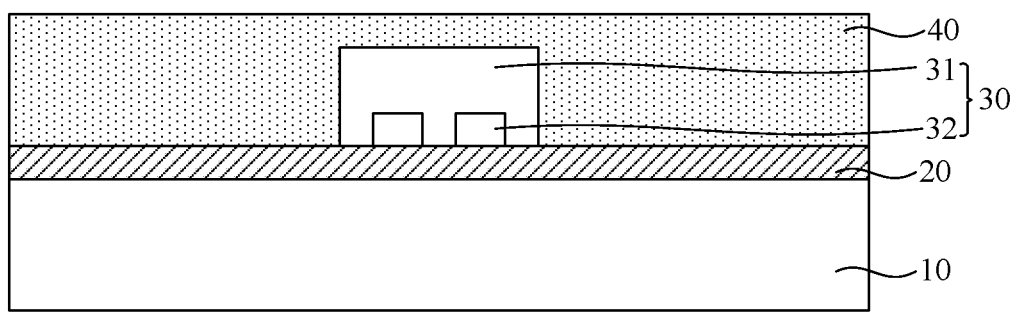

As illustrated in FIG. 5, a plastic packaging layer 40 is formed on the upper surface of the release layer 20, wherein the plastic packaging layer 40 encloses the chip structure 30.

As an example, the plastic packaging layer 40 is formed by adopting a compression molding process, transfer molding process, liquid sealing molding process, vacuum lamination process, or spin-coating process, such that the plastic packaging layer 40 tightly surrounds the sidewall surface of the chip structure 30 to prevent gaps occurring on the sidewall surface of the chip structure 30, interface delamination can be effectively prevented from occurring, and thus the stability of the packaging structure is improved, wherein the material of the plastic packaging layer 40 includes, but not limited to, polyimide, silica gel or epoxy resin.

Figure 6:
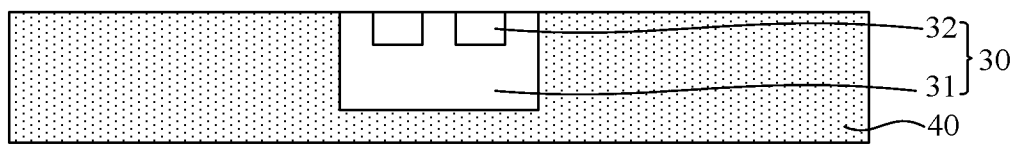

As illustrated in FIG. 6, the carrier 10 and the release layer 20 are removed by adopting a grinding process or thinning process to expose the contact pad 32.

Figure 7:
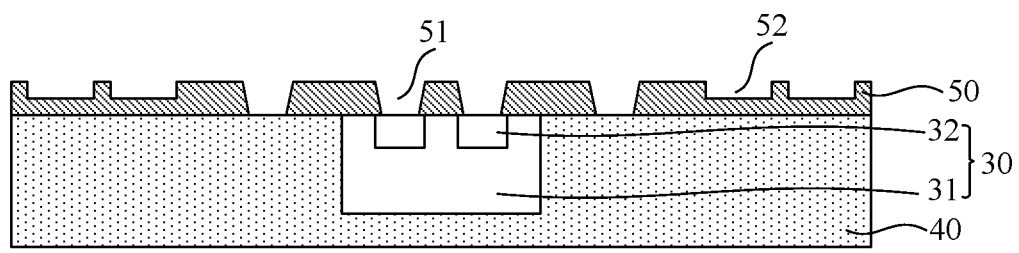
Figure 8:
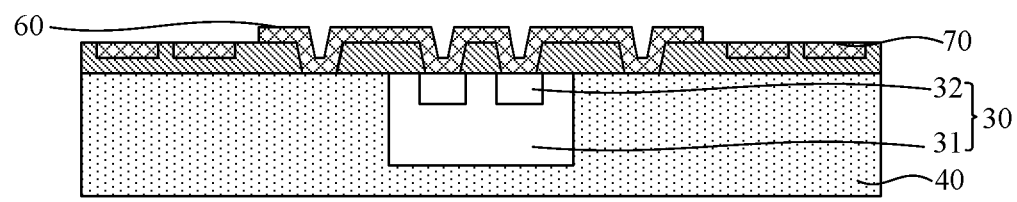

As illustrated in FIG. 7 and FIG. 8, a single-layer antenna structure 70 is formed and a redistribution layer 60 is formed on the surface where the contact pad 32 is disposed, wherein the redistribution layer 60 is electrically connected to the contact pad 32, and the antenna structure 70 is electrically connected to the redistribution layer 60.

As an example, forming the redistribution layer 60 and the antenna structure 70 comprises:

as illustrated in FIG. 7, forming a dielectric layer 50 on the surface where the contact pad 32 is disposed, and performing photo-etching to the dielectric layer 50 to form a first opening 51 and a second opening 52 in the dielectric layer 50, wherein the first opening 51 exposes the contact pad 32; and as illustrated in FIG. 8, forming a metal wire layer in the first opening 51 and the second opening 52, wherein the metal wire layer in the first opening 51 is electrically connected to the contact pad 32 to form the redistribution layer 60, and the metal wire layer in the second opening 52 is electrically connected to the redistribution layer 60 to form the antenna structure 70.

As another example, forming the redistribution layer 60 and the antenna structure 70 comprises:

forming a first dielectric layer on the surface where the contact pad 32 is disposed, and performing photo-etching to the first dielectric layer to form a first opening and a second opening in the first dielectric layer, wherein the first opening exposes the contact pad 32;

forming a first metal wire layer in the first opening and the second opening, wherein the first metal wire layer in the first opening is electrically connected to the contact pad 32, and the first metal wire layer in the second opening forms the antenna structure 70; and forming at least one layer of stack structure consisting of a second dielectric layer and a second metal wire layer on an upper surface of the first metal wire layer to form the redistribution layer 60, wherein the second metal wire layer is electrically connected to the first metal wire layer in the first opening, and the antenna structure 70 is electrically connected to the redistribution layer 60.

It should be noted that the redistribution layer may comprise at least one metal wire layer, when the redistribution layer comprises one metal wire layer, the antenna structure and the redistribution layer are formed by adopting the same photo-etching plate, and when the redistribution layer comprises two or more than two metal wire layers, the antenna structure and the first metal wire layer are formed by adopting the same photo-etching plate.

Figure 9:
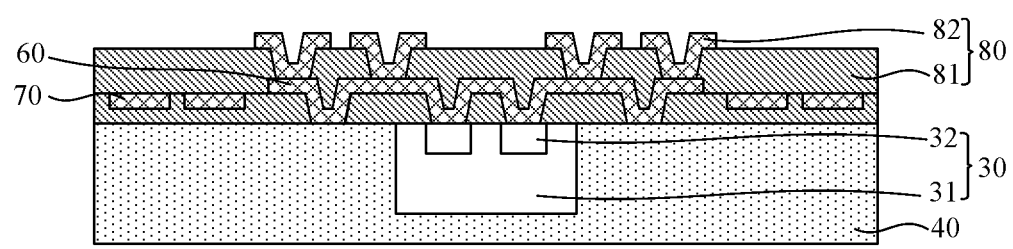

As illustrated in FIG. 9, an under-bump metal layer 80 is formed on an upper surface of the redistribution layer 60.

As an example, forming the under-bump metal layer 80 comprises: forming a dielectric layer 81 on the upper surface of the redistribution layer 60, and performing photo-etching to the dielectric layer 81 to form an opening which exposes the redistribution layer 60; forming a metal wire layer 82 in the opening to serve as an under-bump metal layer 80.

Figure 10:
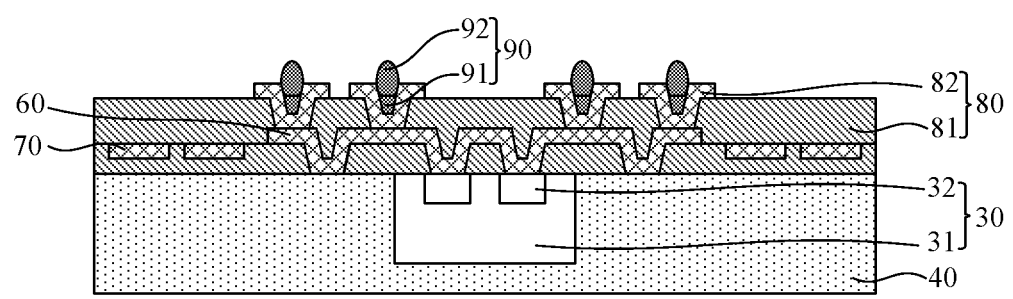

As illustrated in FIG. 10, a solder ball bump 90 is formed on an upper surface of the under-bump metal layer 80.

As an example, forming the solder ball bump 90 comprises: forming a metal pole 91 on the upper surface of the under-bump metal layer 80, and forming a solderball 92 on the upper surface of the metal pole 91.

As an example, the metal pole 91 is formed by adopting physical vapor deposition (PVD), chemical vapor deposition (CVD), sputtering, electroplating or electroless plating, and the solder ball 92 is formed by adopting a ball placement and reflow process.

Figure 11:
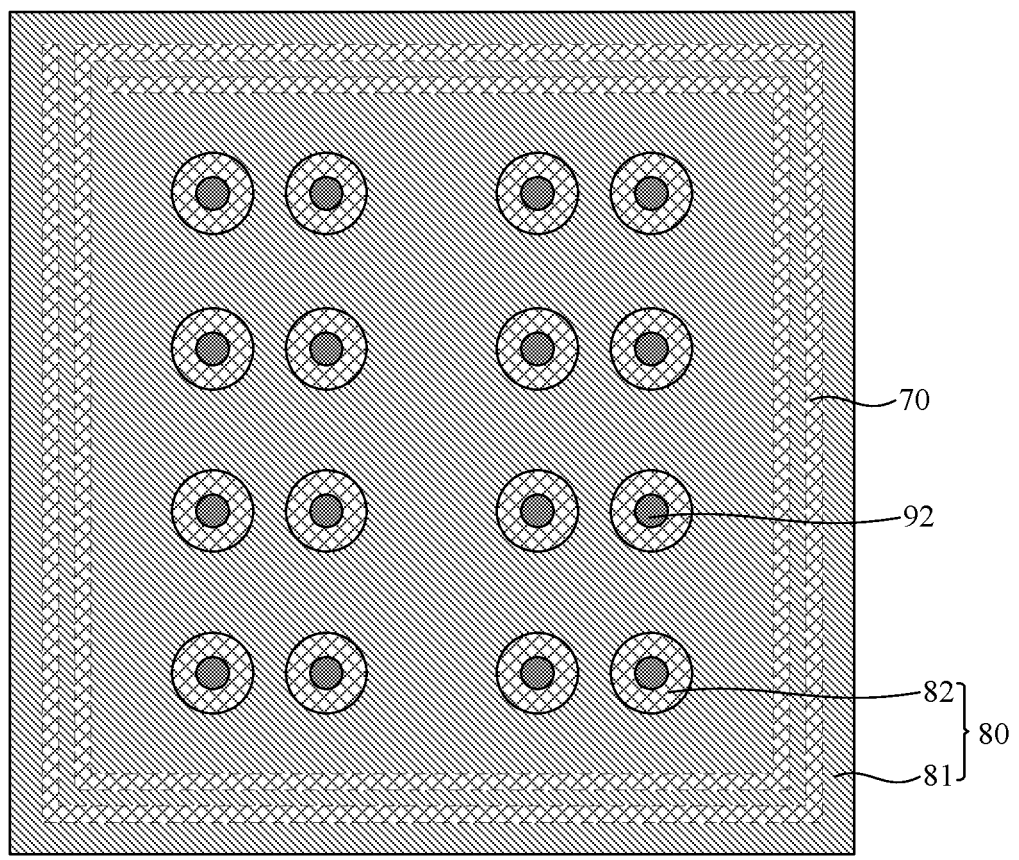
FIGS. 11-14 illustrate top views of exemplary antenna structures in a fan-out antenna packaging structure according to embodiments of the present application.

As an example, as illustrated in FIG. 11, the antenna structure 70 is formed on an outer side of the under-bump metal layer 80, wherein the antenna structure 70 is in a rectangular wire-wound configuration and surrounds the under-bump metal layer 80.

Figure 12:
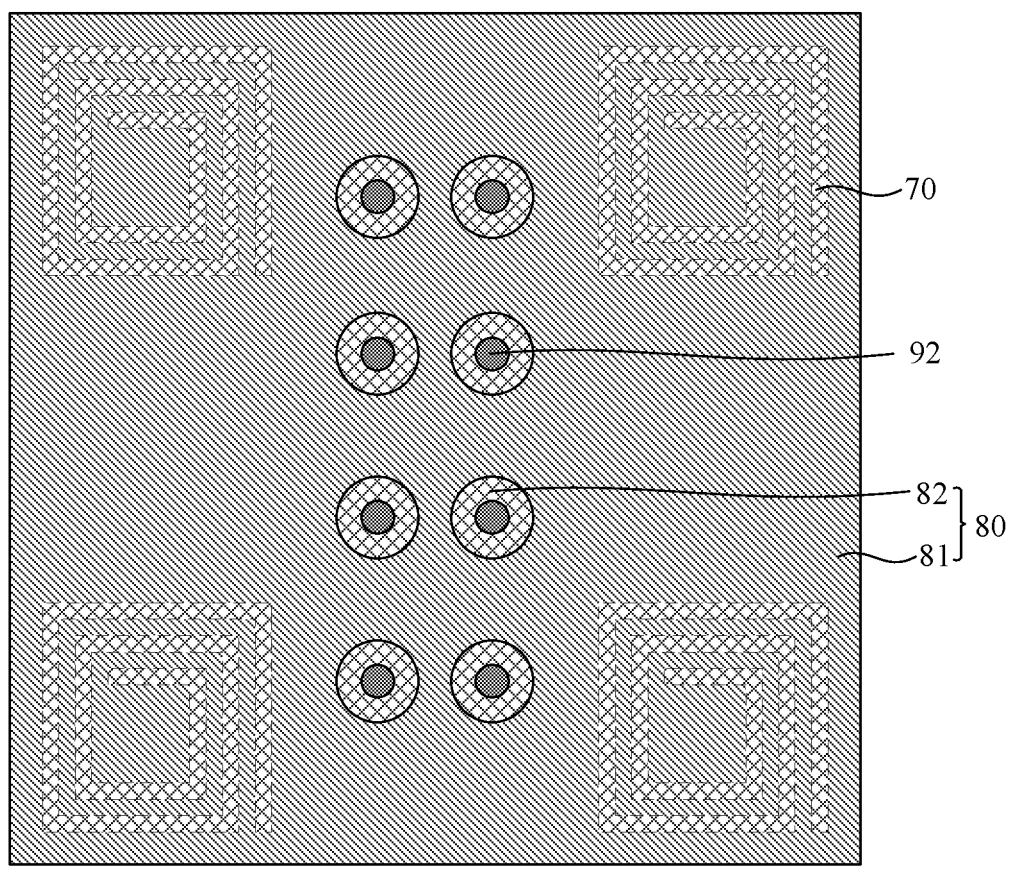

As an example, as illustrated in FIG. 12, the antenna structure 70 is formed on an outer side of the under-bump metal layer 80, wherein the antenna structure 70 comprises at least one antenna unit, and the antenna unit is in a rectangular wire-wound configuration.

Figure 13:
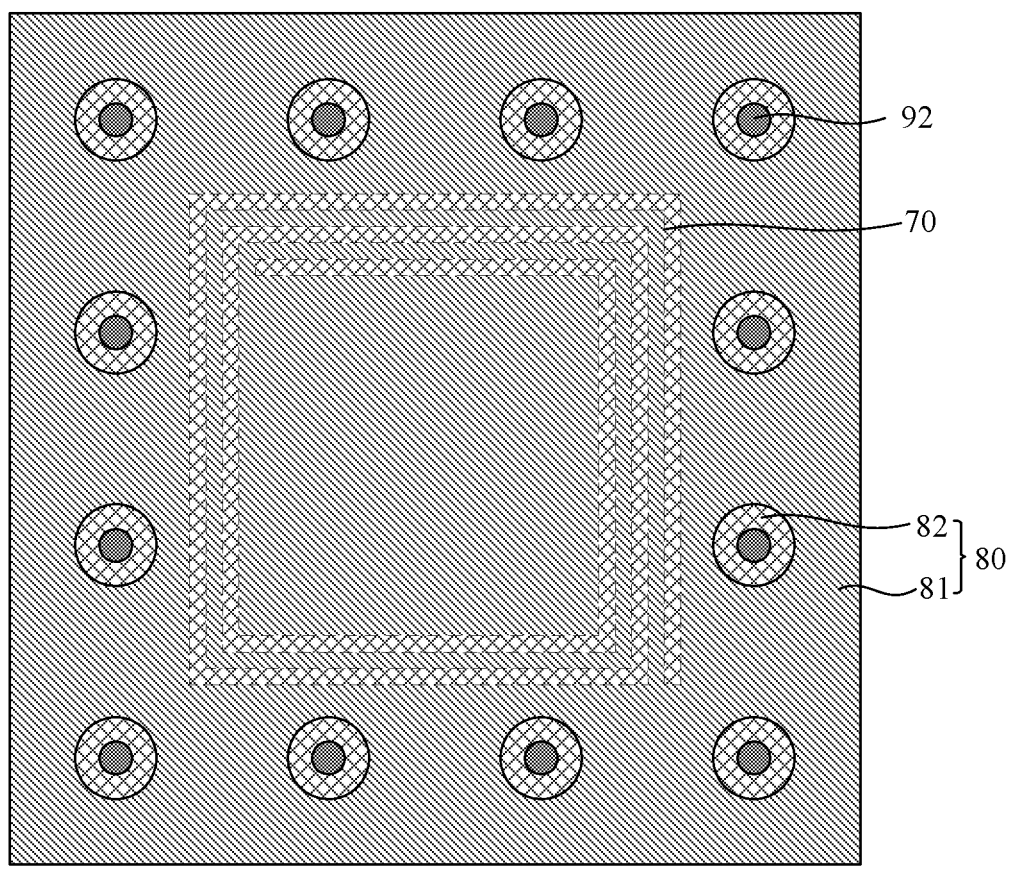
Figure 14:
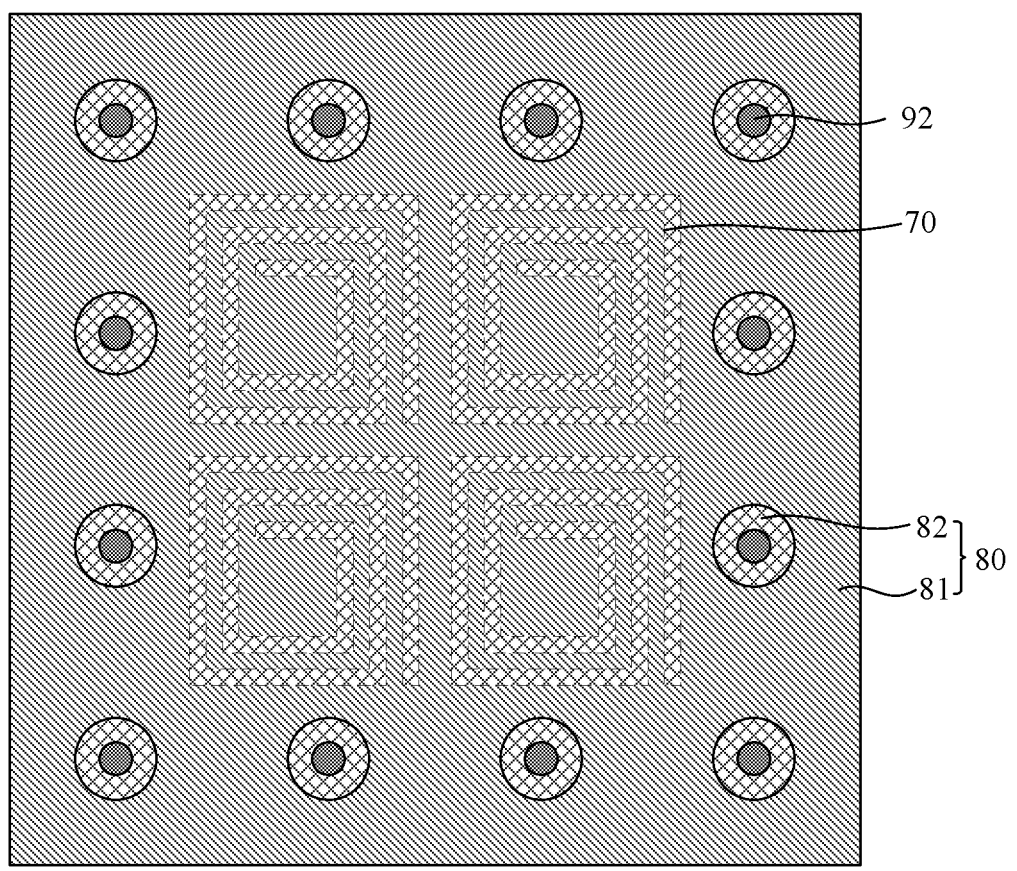

As an example, as illustrated in FIGS. 13 and 14, the antenna structure 70 is formed on an inner side of the under-bump metal layer 80, wherein the antenna structure 70 comprises at least one antenna unit, and the antenna unit is in a rectangular wire-wound configuration.

Embodiment 2

As illustrated in FIG. 10, this embodiment provides a fan-out antenna packaging structure, comprising:
a chip structure 30 comprising an unpacked chip 31 and a contact pad 32 disposed on and electrically connected to the unpacked chip 31;
a plastic packaging layer 40 surrounding the chip structure 30 and exposing the surface where the contact pad 32 is disposed;
a redistribution layer 60 and a single-layer antenna structure 70 formed on the plastic packaging layer 40 and an upper surface of the chip structure 30, wherein the redistribution layer 60 is electrically connected to the contact pad 32, and the antenna structure 70 is electrically connected to the redistribution layer 60;
an under-bump metal layer 80 formed on an upper surface of the redistribution layer 60; and
a solder ball bump 90 formed on an upper surface of the under-bump metal layer 80.

As an example, the chip structure 30 may be any one of existing radio frequency communication chips for transmitting and receiving communication information.

As an example, the material of the contact pad 32 includes, but not limited to, one or more of copper, aluminum, nickel, gold, silver, tin, and titanium.

As an example, the material of the plastic packaging layer 40 includes, but not limited to, polyimide, silica gel, or epoxy resin; and by enabling the plastic packaging layer 40 to tightly surrounds the sidewall surface of the chip structure 30, a gap is prevented from occurring in the sidewall surface of the chip structure 30, an interface delamination can be effectively prevented from occurring, and thus the stability of the packaging structure is improved.

As an example, the redistribution layer 60 comprises at least one stack structure formed on the plastic packaging layer 40 and the upper surface of the chip structure 30, wherein the stack structure comprises a dielectric layer and a metal wire layer.

Specifically, the material of the dielectric layer includes, but not limited to, silicon dioxide, and the material of the metal wire layer includes, but not limited to, one or more of copper, aluminum, nickel, gold, silver, tin, and titanium.

As an example, as illustrated in FIG. 11, the antenna structure 70 is formed on an outer side of the under-bump metal layer 80, is in a rectangular wire-wound configuration and surrounds the under-bump metal layer 80.

As an example, as illustrated in FIG. 12, the antenna structure 70 comprises at least one antenna unit formed on an outer side of the under-bump metal layer 80, wherein the antenna unit is in a rectangular wire-wound configuration.

As an example, as illustrated in FIGS. 13 and 14, the antenna structure 70 comprises at least one antenna unit formed on an inner side of the under-bump metal layer 80, wherein the antenna unit is in a rectangular wire-wound configuration.

As an example, the under-bump metal layer 80 comprises: a dielectric layer 81 formed on the upper surface of the redistribution layer and having an opening, and a metal wire layer 82 formed in the opening.

Specifically, the material of the dielectric layer includes, but not limited to, silicon dioxide, and the material of the metal wire layer includes, but not limited to, one or more of copper, aluminum, nickel, gold, silver, tin, and titanium.

As an example, the solder ball bump 90 comprises a metal pole 91 formed on the upper surface of the under-bump metal layer 80 and a solder ball 92 formed on the upper surface of the metal pole 91.

Specifically, the materials of the metal pole 91 and the solder ball 92 both include, but not limited to, one or more of copper, aluminum, nickel, gold, silver, tin, and titanium.

To sum up, the fan-out antenna packaging structure and the method making the same provided by the present application have the following beneficial effects: by forming the single-layer antenna structure and forming the redistribution layer in the present application, i.e., using the same photo-etching plate to form the redistribution layer and the antenna structure, the manufacturing cost is greatly reduced; moreover, through the design of the antenna structure in the present application, the size of the antenna structure is greatly reduced, the width of the antenna structure is reduced, and the gain of the antenna structure is greatly improved; and by integrally packaging the antenna structure on the chip structure, the integration of the chip packaging structure is improved. Therefore, the present application effectively overcomes various disadvantages in the prior art and has a great industrial utilization value.

The above-mentioned embodiments are only used for exemplarily describing the principle and effects of the present application instead of limiting the present application. One skilled in the art may make modifications or changes to the above-mentioned embodiments without departing from the spirit and scope of the present application. Therefore, all equivalent modifications or changes made by those who have common knowledge in the art without departing from the spirit and technical thought disclosed by the present application shall be still covered by the claims of the present application.

The invention claimed is:
1. A method for fabricating a fan-out antenna packaging structure, comprising:
step 1) providing a carrier and forming a release layer on an upper surface of the carrier;
step 2) forming a chip structure on an upper surface of the release layer, wherein the chip structure comprises an unpacked chip and a contact pad disposed on and electrically connected to the unpacked chip, wherein the contact pad is in contact with the release layer;
step 3) forming a plastic packaging layer on the upper surface of the release layer, wherein the plastic packaging layer encloses the chip structure;
step 4) removing the carrier and the release layer to expose the contact pad;
step 5) forming a single-layer antenna structure and forming a redistribution layer on the surface where the contact pad is disposed, wherein the redistribution layer is electrically connected to the contact pad and the antenna structure is electrically connected to the redistribution layer;

step 6) forming an under-bump metal layer on an upper surface of the redistribution layer; and step 7) forming a solder ball bump on an upper surface of the under-bump metal layer.

2. The method for fabricating the fan-out antenna packaging structure according to claim 1, characterized in that forming the redistribution layer and the antenna structure comprises:

step 5.1a) forming a dielectric layer on the surface where the contact pad is disposed, and performing photo-etching to the dielectric layer to form a first opening and a second opening in the dielectric layer, wherein the first opening exposes the contact pad; and step 5.2a) forming a metal wire layer in the first opening and the second opening, wherein the metal wire layer in the first opening is electrically connected to the contact pad to form the redistribution layer, and the metal wire layer in the second opening is electrically connected to the redistribution layer to form the antenna structure.

3. The method for fabricating the fan-out antenna packaging structure according to claim 1, characterized in that forming the redistribution layer and the antenna structure comprises:

step 5.1b) forming a first dielectric layer on the surface where the contact pad is disposed, and performing photo-etching to the first dielectric layer to form a first opening and a second opening in the first dielectric layer, wherein the first opening exposes the contact pad;

step 5.2b) forming a first metal wire layer in the first opening and the second opening, wherein the first metal wire layer in the first opening is electrically connected to the contact pad, and the first metal wire layer in the second opening forms the antenna structure; and step 5.3b) forming at least one layer of stack structure consisting of a second dielectric layer and a second metal wire layer on an upper surface of the first metal wire layer to form the redistribution layer, wherein the second metal wire layer is electrically connected to the first metal wire layer in the first opening, and the antenna structure is electrically connected to the redistribution layer.

4. The method for fabricating the fan-out antenna packaging structure according to claim 1, characterized in that the antenna structure is formed with a projection on the plastic packaging layer surrounding a projection of the under-bump metal layer on the plastic packaging layer, and wherein the antenna structure is in a rectangular wire-wound configuration made in the single-layer.

5. The method for fabricating the fan-out antenna packaging structure according to claim 1, characterized in that the antenna structure is formed with a projection on the plastic packaging layer surrounding a projection of the under-bump metal layer on the plastic packaging layer, wherein the antenna structure comprises at least one antenna unit, and the antenna unit is in a rectangular wire-wound configuration made in the single-layer.

6. The method for fabricating the fan-out antenna packaging structure according to claim 1, characterized in that the antenna structure is formed with a projection on the plastic packaging layer being surrounded by a projection of the under-bump metal layer on the plastic packaging layer, wherein the antenna structure comprises at least one antenna unit, and the antenna unit is in a rectangular wire-wound configuration made in the single-layer.

7. A fan-out antenna packaging structure, comprising:
a chip structure comprising an unpacked chip and a contact pad disposed on and electrically connected to the unpacked chip;
a plastic packaging layer surrounding the chip structure and exposing the surface where the contact pad is disposed;
a redistribution layer and a single-layer antenna structure formed on the plastic packaging layer and an upper surface of the chip structure, wherein the redistribution layer is electrically connected to the contact pad, and the antenna structure is electrically connected to the redistribution layer;
an under-bump metal layer formed on an upper surface of the redistribution layer; and
a solder ball bump formed on an upper surface of the under-bump metal layer.

8. The fan-out antenna packaging structure according to claim 7, characterized in that the redistribution layer comprises at least one layer of stack structure formed on the plastic packaging layer and the upper surface of the chip structure, wherein the stack structure comprises a dielectric layer and a metal wire layer.

9. The fan-out antenna packaging structure according to claim 7, characterized in that the antenna structure is formed with a projection on the plastic packaging layer surrounding a projection of the under-bump metal layer on the plastic packaging layer, is in a rectangular wire-wound configuration made in the single-layer.

10. The fan-out antenna packaging structure according to claim 7, characterized in that the antenna structure comprises at least one antenna unit with a projection on the plastic packaging layer surrounding a projection of the under-bump metal layer on the plastic packaging layer, and wherein the antenna unit is in a rectangular wire-wound configuration made in the single-layer.

11. The fan-out antenna packaging structure according to claim 7, characterized in that the antenna structure comprises at least one antenna unit formed with a projection on the plastic packaging layer being surrounded by a projection of the under-bump metal layer on the plastic packaging layer, and wherein the antenna unit is in a rectangular wire-wound configuration made in the single-layer.

* * * * *

UNITED STATES PATENT AND TRADEMARK OFFICE
CERTIFICATE OF CORRECTION

PATENT NO.         : 10,714,435 B2
APPLICATION NO.    : 16/209799
DATED              : December 4, 2018
INVENTOR(S)        : Yenheng Chen et al.

Page 1 of 1

It is certified that error appears in the above-identified patent and that said Letters Patent is hereby corrected as shown below:

Add Item (30):
-- (30) Foreign Application Priority Data
      Dec. 4, 2017 (CN)      2017112594894
      Dec. 4, 2017 (CN)      2017216628838 --

Signed and Sealed this
Twenty-sixth Day of January, 2021

Drew Hirshfeld
*Performing the Functions and Duties of the*
*Under Secretary of Commerce for Intellectual Property and*
*Director of the United States Patent and Trademark Office*